United States Patent
Wang

(10) Patent No.: US 8,500,974 B2
(45) Date of Patent: *Aug. 6, 2013

(54) CARRIER AND SPUTTERING DEVICE USING THE SAME

(75) Inventor: Chung-Pei Wang, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 413 days.

This patent is subject to a terminal disclaimer.

(21) Appl. No.: 12/817,191

(22) Filed: Jun. 17, 2010

(65) Prior Publication Data

US 2011/0048937 A1    Mar. 3, 2011

(30) Foreign Application Priority Data

Sep. 2, 2009   (CN) .......................... 2009 1 0306509

(51) Int. Cl.
| | |
|---|---|
| C23C 16/00 | (2006.01) |
| C23C 14/00 | (2006.01) |
| C25B 9/00 | (2006.01) |
| C25B 11/00 | (2006.01) |
| C25B 13/00 | (2006.01) |
| B23Q 3/00 | (2006.01) |
| B25B 1/00 | (2006.01) |
| B25B 1/04 | (2006.01) |
| B25B 1/08 | (2006.01) |
| B25B 1/02 | (2006.01) |
| B25B 5/02 | (2006.01) |
| B25B 5/06 | (2006.01) |
| B25B 1/06 | (2006.01) |
| B43L 5/02 | (2006.01) |
| H01L 21/687 | (2006.01) |

(52) U.S. Cl.
USPC . 204/298.15; 118/729; 118/730; 204/298.23; 204/298.27; 204/298.28; 204/298.29; 269/48.4; 269/160; 269/161; 269/162; 269/215; 269/254 CS; 269/254 R

(58) Field of Classification Search
USPC ................ 118/730, 729; 204/298.27, 298.28, 204/298.15, 298.23, 298.29; 269/48.4, 160, 269/161, 215, 254 CS, 254 R
See application file for complete search history.

(56) References Cited

U.S. PATENT DOCUMENTS

| | | | |
|---|---|---|---|
| 8,101,055 B2 * | 1/2012 | Matsui et al. ............ | 204/298.28 |
| 2010/0213053 A1 * | 8/2010 | Wang ....................... | 204/298.12 |

FOREIGN PATENT DOCUMENTS

KR   2002078618 A  * 10/2002

* cited by examiner

Primary Examiner — Michael Band
(74) Attorney, Agent, or Firm — Altis Law Group, Inc.

(57) ABSTRACT

A carrier for use during sputtering includes a main body and support members. The main body defines a receiving space and includes a lateral surface defining at least one groove extending along a longitudinal direction. The receiving space and the at least one groove communicate with each other. The at least one groove is defined by a first surface and a second surface. The first surface defines recessed portions along the longitudinal direction and communicates with the receiving space. The support members are used for hanging workpieces. Each of the support members includes at least one support arm protruding from the lateral surface and is selectively and movably retained by one of the recessed portions.

1 Claim, 4 Drawing Sheets

CARRIER AND SPUTTERING DEVICE USING THE SAME

BACKGROUND

1. Technical Field

The present disclosure relates to sputtering devices and, more particularly, to a sputtering device having a carrier with adjustable support members.

2. Description of Related Art

Sputtering is a process whereby atoms are ejected from a solid target material due to bombardment of the target by energetic particles, which is commonly used for thin film deposition. During the process of sputtering, workpieces are hung on support arms protruding from a rotary member of a carrier. Generally, the support arms are fixed to the rotary member and the distances between the support arms are fixed. The fixed distances limit the sizes of workpieces that can be hung on the support arms.

Therefore, what is needed is a carrier for use during sputtering to overcome the aforementioned problem.

BRIEF DESCRIPTION OF THE DRAWINGS

The components in the drawings are not necessarily drawn to scale, the emphasis instead being placed upon clearly illustrating the principles of the carrier. Moreover, in the drawings, like reference numerals designate corresponding parts throughout the several views.

DETAILED DESCRIPTION

Figure 1:
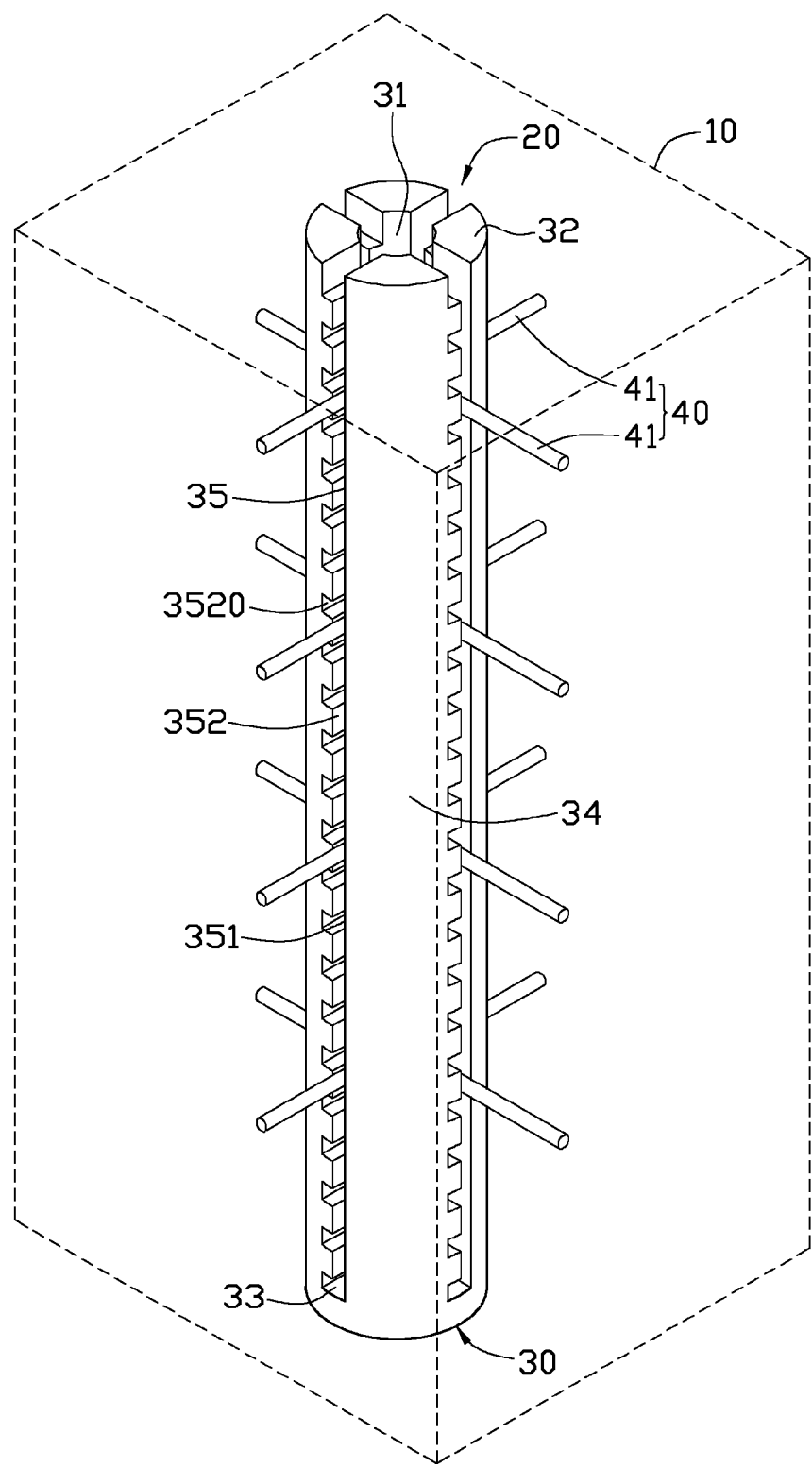
FIG. 1 is an isometric view of a carrier of a sputtering device in accordance with an exemplary embodiment.
Figure 2:
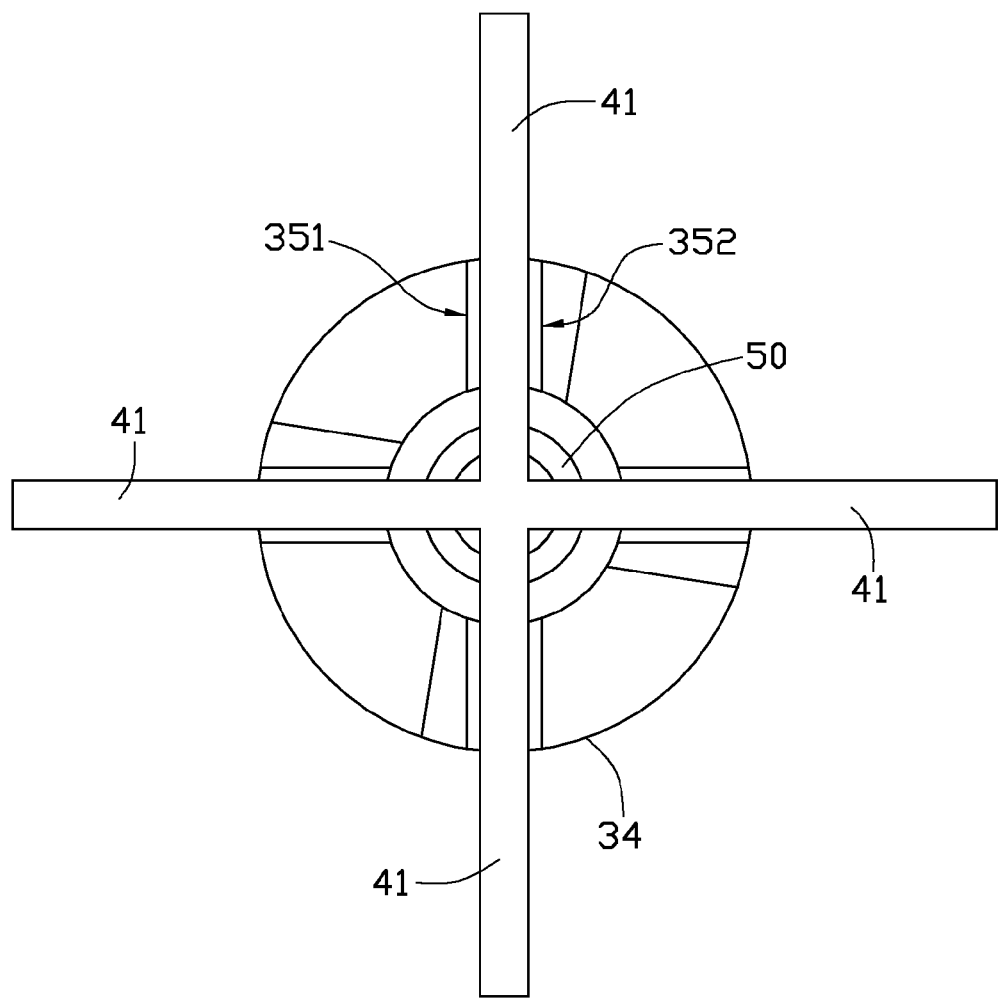
FIG. 2 is a planar top view of the carrier of FIG. 1.
Figure 3:
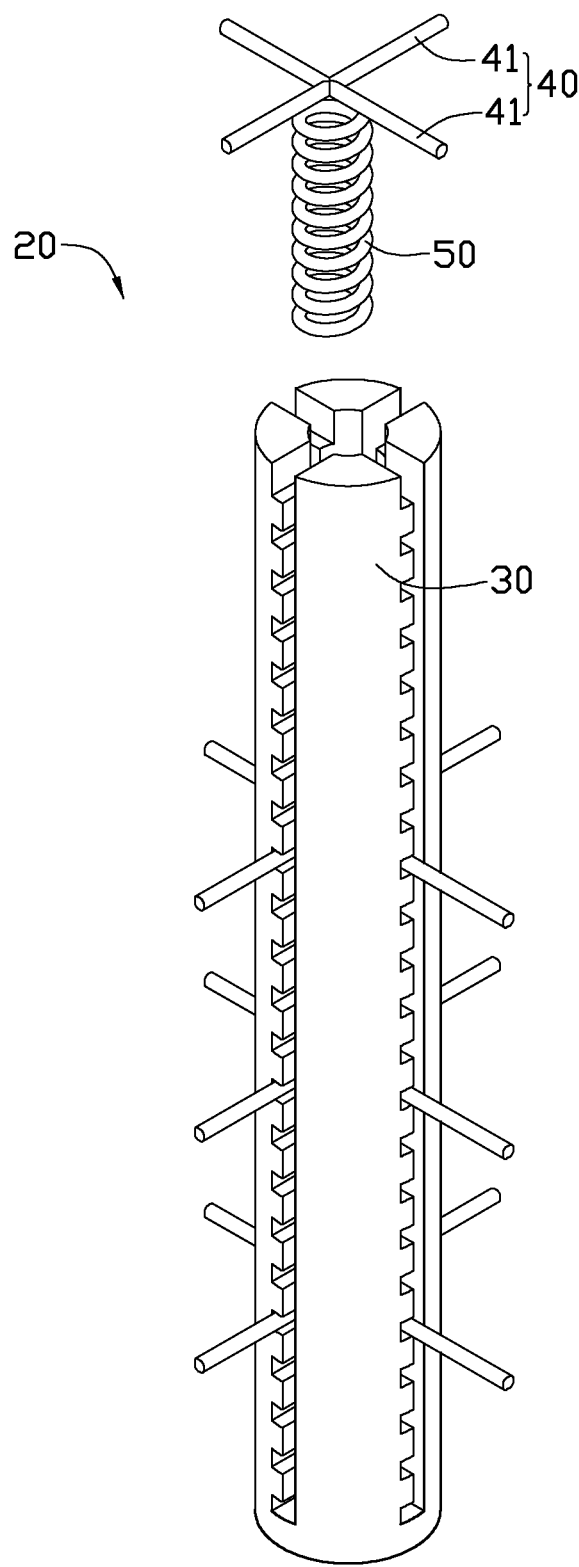
FIG. 3 is an isometric, exploded view of the carrier of FIG. 1.

Embodiments of the present disclosure will now be described in detail below, with reference to the accompanying drawings. Referring to FIGS. 1-3, a sputtering device 10 includes a carrier 20. The carrier 20 includes a rotary member 30 and a plurality of support members 40 for hanging workpieces.

The rotary member 30 can be a cylinder and defines a receiving space 31 that extends along a longitudinal direction and includes an open end 32 and a closed end 33. The cylinder 30 also includes a lateral surface 34 defining a plurality of grooves 35 that extend along the longitudinal direction from the open end 32 to the closed end 33, and communicate with the receiving space 31.

Each groove 35 is defined by a first side surface 351 and a second side surface 352 facing each other. The side surface 352 defines a plurality of recessed portions 3520 extending from the lateral surface 34 to the inner surface of the receiving space 31. In the embodiment, the recessed portions 3520 are evenly spaced from each other.

Each support member 40 can include four arms 41 connected together to form a cross. Each arm 41 extends through one recessed portion 3520 with one end protruding out of the lateral surface 34 and an opposite end received in the receiving space 31. In another embodiment, the number of the arms 41 may be one or more according to need. When only one arm 41 is used, the recessed portion 3520 can be replaced with a through hole extending through the lateral surface 34. The arm 41 passes through the through hole and is thus movably connected to the rotary member 30.

When needing to adjust the distance between two neighboring support members 40 (hereinafter a first member 40 and a second member 40), the first member 40 can be rotated to cause the arms 41 to move out of the recessed portions 3520 and into the grooves 35. The arms 41 can thus move along the groove 35 to a position where a desired distance between the first member 40 and the second member 40 is obtained. The first member 40 is then rotated again to cause the arms 41 to move into the recessed portions 35 adjacent to the position. The first member 40 is thus held in position.

In the embodiment, a plurality of resilient members 50 may be used. Each resilient member 50 is received in the receiving space 31 and arranged between two neighboring support members 40 to apply a pushing force to the neighboring support members 40, such that the neighboring support members 40 each can engage the recessed portions 3520 tightly. The plurality of resilient members 50 may be coil springs.

Figure 4:
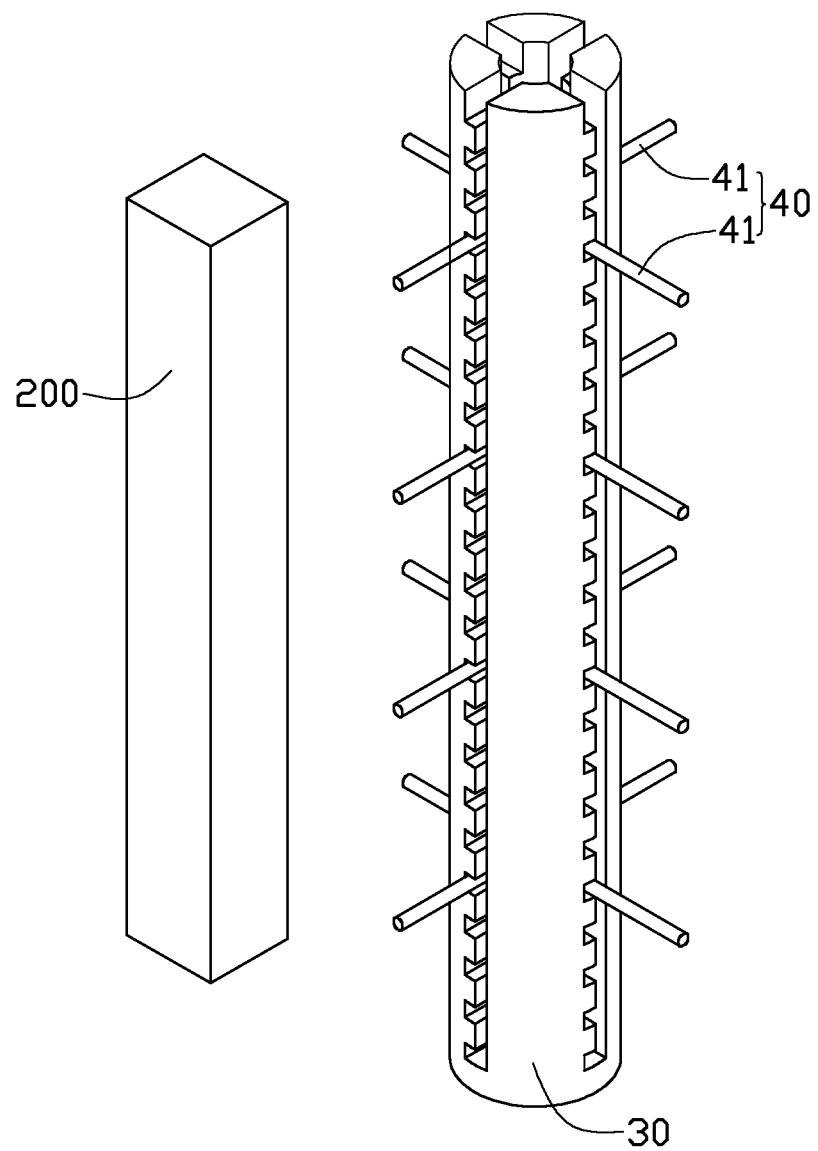
FIG. 4 shows a target and the carrier of FIG. 1.

Referring to FIG. 4, when sputtering, workpieces (not shown) can be attached to the arms 41 in any conventional connection techniques. The rotary member 30 then rotates to allow every workpiece to face a target 200 to be coated.

While various embodiments have been described and illustrated, the disclosure is not to be constructed as being limited thereto. Various modifications can be made to the embodiments by those skilled in the art without departing from the true spirit and scope of the disclosure as defined by the appended claims.

What is claimed is:

1. A carrier for use during sputtering, comprising:
   a main body defining a receiving space and comprising a lateral surface defining at least one groove extending along a longitudinal direction of the main body, the receiving space and the at least one groove communicating with each other, the at least one groove being defined by a first surface and a second surface, the first surface defining a plurality of recessed portions along the longitudinal direction and communicating with the receiving space;
   a plurality of support members for hanging workpieces, each of the plurality of support members comprising at least one support arm protruding from the lateral surface and being selectively and movably retained within one of the recessed portions; and
   a plurality of resilient members, wherein each of the plurality of resilient members is arranged between two neighboring support members to apply a pushing force to the two neighboring support members, the plurality of resilient members are coil springs.

* * * * *